(12) United States Patent
Hwang et al.

(10) Patent No.: US 11,950,489 B2
(45) Date of Patent: Apr. 2, 2024

(54) DEPOSITION MASK, METHOD OF MANUFACTURING THE SAME, AND METHOD OF MANUFACTURING DISPLAY PANEL

(71) Applicant: SAMSUNG DISPLAY CO., LTD., Yongin-si (KR)

(72) Inventors: Kyu Hwan Hwang, Seongnam-si (KR); Jeongkuk Kim, Suwon-si (KR); Hwi Kim, Suwon-si (KR); Kanghyun Nam, Asan-si (KR); Sangha Park, Seoul (KR); Areum Lee, Suwon-si (KR); Da-Hee Jeong, Seoul (KR); Eunbee Jo, Hwaseong-si (KR); Seungmin Jin, Cheonan-si (KR); Jaemin Hong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 324 days.

(21) Appl. No.: 17/326,194

(22) Filed: May 20, 2021

(65) Prior Publication Data

US 2022/0093863 A1 Mar. 24, 2022

(30) Foreign Application Priority Data

Sep. 24, 2020 (KR) .................. 10-2020-0124048

(51) Int. Cl.
*H10K 71/16* (2023.01)
*C23C 14/04* (2006.01)
(Continued)

(52) U.S. Cl.
CPC ......... *H10K 71/166* (2023.02); *C23C 14/042* (2013.01); *C23C 14/24* (2013.01);
(Continued)

(58) Field of Classification Search
CPC ...... H10K 71/166; H10K 59/12; H10K 71/00; H10K 71/164; C23C 14/042; C23C 14/24; C23C 16/042
See application file for complete search history.

(56) References Cited

U.S. PATENT DOCUMENTS 10,428,415 B2 * 10/2019 Park ............... C23C 14/042
10,680,177 B2    6/2020 Park et al.
(Continued)

FOREIGN PATENT DOCUMENTS

CN         111057997 A  *  4/2020  ........... C23C 14/042
KR    10-2016-0074038        6/2016
(Continued)

*Primary Examiner* — David Vu
*Assistant Examiner* — Brandon C Fox
(74) *Attorney, Agent, or Firm* — H.C. Park & Associates, PLC

(57) ABSTRACT

A deposition mask for manufacturing a display panel includes a metallic base having a thickness of about 50 micrometers to about 200 micrometers and a plurality of openings defined therein, wherein at least some of the openings include a first opening having a first width and a second opening having a second width smaller than the first width respectively defined along a thickness direction of the metallic base, and wherein the metallic base includes a first part in which the first opening is defined, and a second part in which the second opening is defined, the second part having a width that increases in a direction downward from a top surface of the metallic base along the thickness direction of the metallic base.

14 Claims, 16 Drawing Sheets

(51) Int. Cl.
  *C23C 14/24* (2006.01)
  *H10K 59/12* (2023.01)
  *H10K 71/00* (2023.01)
(52) U.S. Cl.
  CPC .............. *H10K 59/12* (2023.02); *H10K 71/00* (2023.02); *H10K 71/164* (2023.02)

(56) References Cited

U.S. PATENT DOCUMENTS

2017/0069843 A1* 3/2017 Kang .................. H10K 71/166
2017/0107605 A1* 4/2017 Chun ........................ C23F 1/02
2019/0148641 A1* 5/2019 Kim .................. B23K 26/0624
                                                       219/121.69
2021/0108312 A1* 4/2021 Oka ........................ C22C 38/04

FOREIGN PATENT DOCUMENTS

| KR | 10-1674499 | 11/2016 |
|---|---|---|
| KR | 10-1674506 | 11/2016 |
| KR | 10-1900281 | 9/2018 |
| KR | 10-2000548 | 7/2019 |

* cited by examiner

DEPOSITION MASK, METHOD OF MANUFACTURING THE SAME, AND METHOD OF MANUFACTURING DISPLAY PANEL

CROSS-REFERENCE TO RELATED APPLICATION

This application claims priority from and the benefit of Korean Patent Application No. 10-2020-0124048, filed on Sep. 24, 2020, which is hereby incorporated by reference for all purposes as if fully set forth herein.

BACKGROUND

Field

Embodiments of the invention relate generally to a deposition mask, a method of manufacturing the same, and a method of manufacturing a display panel and, more particularly, to a deposition mask having an improved process yield and deposition precision, a method of manufacturing the same, and a method of manufacturing a display panel.

Discussion of the Background

A display panel includes a plurality of pixels. Each of the pixels includes a driving element such as a transistor, and a display element such as an organic light emitting diode (OLED). The display element may be formed by stacking, on a substrate or wafer, electrodes, a plurality of organic, and a plurality of inorganic layers.

Electrodes, a plurality of organic layers, a plurality of inorganic layers, etc., which are included in a display element, may be formed on a substrate or wafer via deposition patterns formed in a predetermined area of a substrate or a wafer through a deposition process. A deposition pattern may be obtained by patterning using a mask in which a through-part, i.e., an opening, is defined so that the deposition pattern is formed in a predetermined area. The deposition pattern may be formed in an area exposed by the through-part. The shape of the deposition pattern may be controlled according to the shape of the through-part.

The above information disclosed in this Background section is only for understanding of the background of the inventive concepts, and, therefore, it may contain information that does not constitute prior art.

SUMMARY

Applicant realized that use of an imprecise deposition mask may create dead spaces in a display panel manufactured by such a deposition mask due to e.g., shadowing effects, and thus defects in the display panel affecting reliability or performance may result.

Deposition masks constructed according to the principles and illustrative implementations of the invention, methods of manufacturing the same, and methods of manufacturing a display panel using the same have improved process yield and deposition precision, while increasing the reliability of the deposition mask. For example, precise formation of cell areas on a substrate or a wafer may be achieved, so that a display panel made by a deposition mask constructed according to the principles and implementations of the invention minimizes dead spaces and defects in the display panel.

Display panels constructed according to the principles and implementations of the invention avoid deleterious effects such as those caused by shadowing that may otherwise hinder the precise formation of those pixels and other components during manufacture.

Additional features of the inventive concepts will be set forth in the description which follows, and in part will be apparent from the description, or may be learned by practice of the inventive concepts described herein.

According to one aspect of the invention, a deposition mask includes: a metallic base having a thickness of about 50 micrometers to about 200 micrometers and having a plurality of openings defined therein, wherein at least some of the plurality of openings include a first opening having a first width and a second opening having a second width smaller than the first width respectively defined along a thickness direction of the metallic base, and wherein the metallic base includes a first part in which the first opening is defined, and a second part in which the second opening is defined, the second part having a width that increases in a direction downward from a top surface of the metallic base along the thickness direction of the metallic base.

The second part may be disposed on the first part, and the thickness of the first part may be about 5% to about 50% of the total thickness of the metallic base.

The first part may be disposed on the second part and the thickness of the first part may be about 30% to about 80% of the total thickness of the metallic base.

The first part may include a first sub-part disposed on the second part, and a second sub-part disposed under the second part, and the thicknesses of the first and second sub-parts may be each about 5% to about 40% of the total thickness of the metallic base.

The mask body may have invar.

The first part may include a first side surface defining the first through-part and may have a rounded shape of which the slope changes toward the thickness direction of the metallic base.

The second part may include a second side surface defining the second through-part, and inclined at a predetermined taper angle.

The taper angle may be about 30° to 70°.

The opening may include through-parts and the width of each of the plurality of through-parts may be about 10 mm to 400 mm.

According to another aspect of the invention, a method of manufacturing a deposition mask for a display panel includes: preparing a base having a thickness of about 50 micrometers to about 200 micrometers; reducing the thickness of the base by wet-etching at least one surface of the base to form a thickness-reduced section; and forming a plurality of openings by irradiating, with a laser, a portion of the thickness-reduced section.

The base may include a base sheet having an upper surface and a lower surface facing the upper surface, the step of reducing the thickness of the base sheet includes wet-etching the lower surface, and the step of forming the plurality of openings includes irradiating the upper surface with the laser.

The base may include a base sheet having an upper surface and a lower surface facing the upper surface, the step of reducing the thickness of the base sheet includes wet-etching the upper surface, and the step of forming the plurality of openings includes irradiating the upper surface with the laser.

The base may include a base sheet having an upper surface and a lower surface facing the upper surface, the step of reducing the thickness of the base sheet includes wet-etching both the upper surface and the lower surface, and the step of forming the plurality of through-parts includes irradiating the upper surface with the laser.

The openings may include through-parts, and the step of forming the plurality of openings includes forming the through-parts to have a width of about 10 mm to about 400 mm.

According to yet another aspect of the invention, a method of manufacturing a display panel includes: preparing a target substrate; forming and disposing, on the target substrate, a deposition mask having a base with a thickness and a plurality of openings defined therein; forming, on the target substrate, a plurality of deposition patterns corresponding to the openings; and removing the deposition mask, wherein the forming of the deposition mask includes: reducing the thickness of the base by wet-etching at least one surface of the base to a thickness of about 50 micrometers to about 200 micrometers to form a thickness-reduced section; and forming a plurality of openings by etching a portion of the thickness-reduced section.

The disposition mask may include: a first part in which a first opening is defined; a second part in which a second opening having a width smaller than the first opening is defined, the second part having a width that increases in a direction downward from a top surface of the metallic base along the thickness direction of the metallic base.

The first part may include a first side surface defining the first opening, and having a rounded shape of which a slope that changes in the thickness direction.

The second part may include a second side surface defining the second opening, and being inclined at a predetermined taper angle so that the thickness thereof increases in a direction toward the target substrate.

The target substrate may include a base substrate and a plurality of circuit element layers disposed on the base substrate, and the plurality of deposition patterns may be common layers respectively disposed on the plurality of circuit element layers.

The plurality of circuit element layers may include a first circuit element layer and a second circuit element layer spaced apart from the first circuit element layer, the plurality of deposition patterns may have a first deposition pattern disposed on the first circuit element layer, and a second deposition pattern disposed on the second circuit element layer, and the first deposition pattern and the second deposition pattern may be spaced apart from each other.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
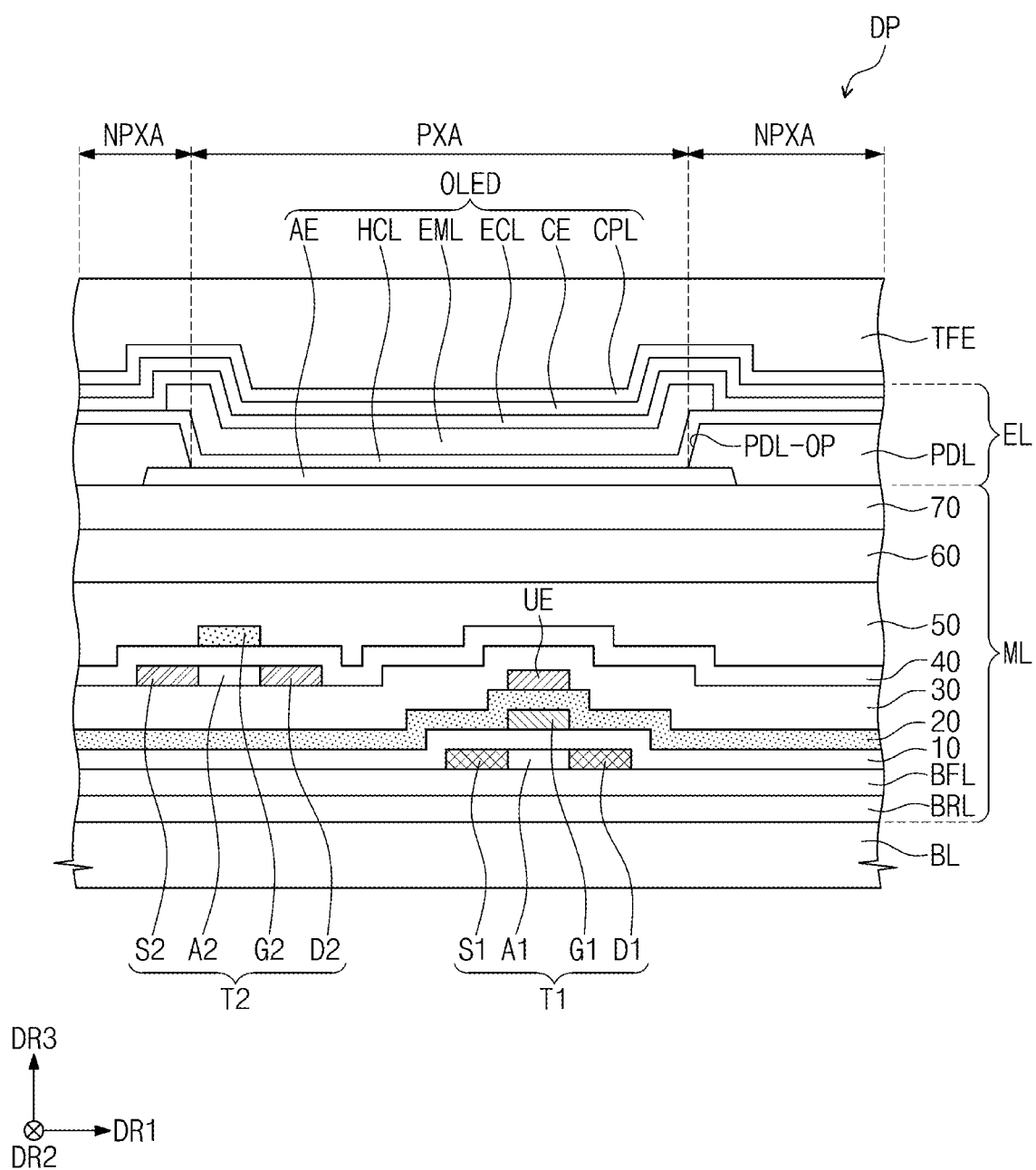
FIG. 1 is a cross-sectional view of an embodiment of a display panel constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a cross-sectional view of a display panel according to an embodiment that has been constructed according to principles of the invention. In this embodiment, a display panel DP may be a light emitting display panel. FIG. 1 illustrates a cross section corresponding to one of a plurality of pixels. The cross section of FIG. 1 shows the disposition of two transistors T1 and T2 and a light emitting element OLED.

An upper surface of each component is substantially parallel to a surface defined by a first direction DR1 and a second direction DR2 substantially orthogonal to the first direction DR1. The thickness direction of each component is indicated by a third direction DR3 that is substantially orthogonal to both the first and second directions DR1, DR2 (i.e., x, y, and z axes of a three-axis coordinate system). The upper side (or top) and the lower side (or bottom) of each component are defined by the third direction DR3. However, the directions indicated by the first to third directions DR1, DR2, and DR3 are relative concepts and may be changed to other directions.

As illustrated in FIG. 1, the display panel includes a base layer BL, a circuit element layer ML disposed on the base layer BL, a display element layer EL disposed on the circuit element layer ML, and an insulating layer disposed on the display element layer EL (ECP, hereinafter defined as an upper insulating layer).

The base layer BL may include a synthetic resin layer. The synthetic resin layer is formed on a support substrate used in manufacturing the display panel DP. Thereafter, a conductive layer, an insulating layer, etc., are formed on the synthetic resin layer. When the support substrate is removed, the synthetic resin layer corresponds to the base layer BL.

The circuit element layer ML includes at least one insulating layer and a circuit element. The circuit element includes signal lines, pixel driving circuits, etc. The circuit element layer may be formed through a process of forming an insulating layer, a semiconductor layer and a conductive layer by coating, deposition, etc., and through a process of patterning the insulating layer, the semiconductor layer and the conductive layer by photolithography.

In this embodiment, the circuit element layer ML includes a buffer layer BFL, a barrier layer BRL, and a plurality of insulating layers 10, 20, 30, 40, 50, 60, and 70. The buffer layer BFL, the barrier layer BRL, and first to seventh insulating layers 10, 20, 30, 40, 50, 60, and 70 may include any one among an inorganic layer and an organic layer. The buffer layer BFL and the barrier layer BRL may include an inorganic layer. At least one among the fifth insulating layer 50, the sixth insulating layer 60, and the seventh insulating layer 70 may include an organic layer.

FIG. 1 illustrates and example of the arrangement relationships of a first active region A1 and a second active region A2, a first gate G1 and a second gate G2, a first source S1 and a second source S2, and a first drain D1 and a second drain D2 which respectively constitute a first transistor T1 and a second transistor T2. In this embodiment, the first active region A1 and the second active region A2 may include different materials. The first active region A1 may include a polysilicon semiconductor, and the second active region A2 may include a metal oxide semiconductor. The first source S1 and the first drain D1 are areas having a higher doping concentration than the first active region A1 and serve as electrodes. The second source S2 and the second drain D2 are areas in which the metal oxide semiconductor is reduced (i.e., have a lesser amount of metal oxide semiconductor material as compared to the first and second active layers A1 and A2), and serve as electrodes.

The first active region A1 and the second active region A2 may include the same semiconductor material, and in this case, the stacked structure of the circuit element layer ML may be further simplified.

The display element layer EL includes a pixel defining layer PDL and a light emitting element OLED. The light emitting element OLED may be an organic light emitting diode or a quantum dot light emitting diode. The light emitting element OLED may include an anode AE, a hole control layer HCL, a light emitting layer EML, an electron control layer ECL, a cathode CE, and an optical control layer CPL which may be stacked in sequence in that order.

The anode AE is disposed on the seventh insulating layer 70. An opening PDL-OP of the pixel defining layer PDL exposes at least a part of the anode AE. The opening PDL-OP of the pixel defining layer PDL may define a light-emitting area PXA. A non-light-emitting area NPXA may surround the light-emitting area PXA.

The hole control layer HCL and the electron control layer ECL may be disposed in both the light-emitting area PXA and the non-light-emitting area NPXA. The light emitting layer EML may be provided in a pattern shape to correspond to the opening PDL-OP. The light emitting layer may be deposited in a manner different from those for the hole control layer HCL and the electron control layer ECL which have a film shape. The hole control layer HCL and the electron control layer ECL may be formed in a plurality of all pixels by using an open mask. The cathode CE is disposed on the electron control layer ECL.

The optical control layer CPL may be disposed on the cathode CE. The optical control layer CPL may include a multilayer or a single layer. The optical control layer CPL may be an organic layer or an inorganic layer, and may be a layer having a refractive index of about 1.6 or more for light in a wavelength range of about 550 nm to about 660 nm.

A thin-film encapsulation layer TFE is disposed on the optical control layer CPL. The thin-film encapsulation layer may be a layer for encapsulating the display element layer EL. The thin-film encapsulation layer TFE may include a plurality of thin films. The plurality of thin film may include an organic film and an inorganic film. The thin-film encapsulation layer TFE may include, for example, an insulating layer for encapsulating the display element layer EL and the insulating layer for improving light emission efficiency.

Thin-film encapsulation layer TFE may include a first inorganic film, an organic film, and a second inorganic film. The first inorganic film and the second inorganic film may include silicon nitride, silicon oxide, or a combination thereof. The first inorganic layer and the second inorganic layer may be formed through a chemical vapor deposition (CVD) method.

The organic layer may provide a flat surface on the first inorganic layer. The irregularities formed on the upper surface of the first inorganic film or particles present on the first inorganic film are covered by the organic film, thereby preventing the surface condition of the upper surface of the first inorganic film from affecting a component, such as the second inorganic film, which is to be formed on the organic film. Furthermore, the inorganic film may relive stress between layers in contact therewith. The organic film may include an organic material, and may also be formed through a solution process such as a spin coating, a slit coating, or an inkjet process.

In FIG. 1, at least one of layers formed in all the plurality of pixels may be deposited and formed through a deposition mask. In an embodiment, at least one among the hole control layer HCL, the electron control layer ECL, the cathode CE, and the optical control layer CPL, which are components included in the display element layer EL, may be deposited and formed through the deposition mask. Alternatively, a thin-film encapsulation layer TFE disposed on the display element layer EL may be formed by depositing through a deposition mask. Hereinafter, the deposition mask constructed according to the principles and an embodiment of the invention will be described in detail.

Figure 2:
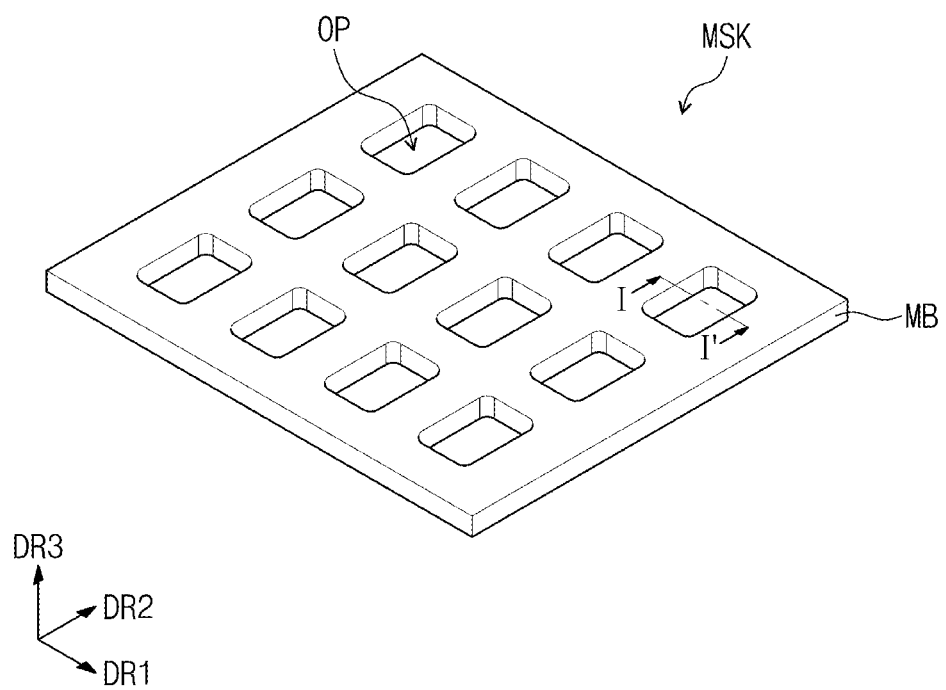
FIG. 2 is a perspective view of an embodiment of a deposition mask constructed according to principles of the invention.
Figure 3A:
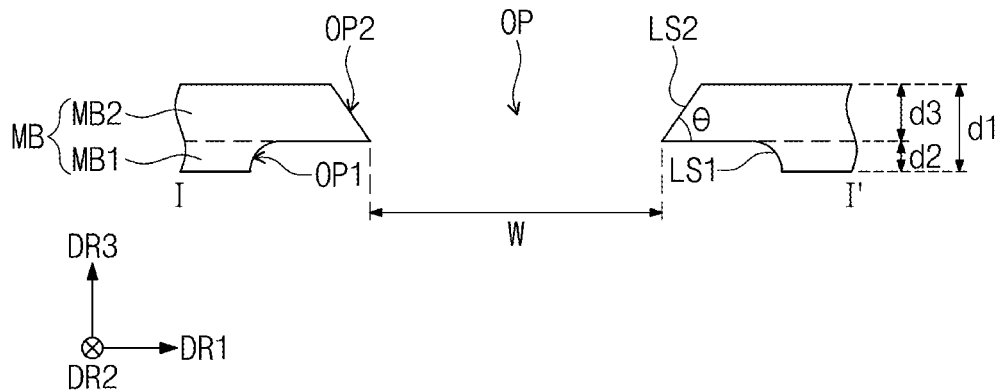
FIGS. 3A, 3B, and 3C are cross-sectional views of a embodiments of deposition masks taken along lines I-I' of FIG. 2.

FIG. 2 is a perspective view of an embodiment of a deposition mask constructed according to principles of the invention. FIG. 3A is a cross-sectional view of a deposition mask according to an embodiment. FIG. 3A illustrates a cross-sectional view of the deposition mask according to an embodiment taken along line I-I' as illustrated in FIG. 2.

As illustrated in FIG. 2, a deposition mask MSK includes a base that may be in the form of a mask body MB in which a plurality of openings that may be in the form of through-parts OP are defined.

At least one through-part OP is defined in the mask body MB. A plurality of through-parts OP are defined in the mask body MB. The plurality of through-parts OP may be spaced apart from each other at regular intervals in the first direction DR1 and/or the second direction DR2, and may form a predetermined pattern, such as a matrix of through-parts. Each of the plurality of through-parts OP may be defined through the deposition mask MSK along the thickness direction DR3 (hereinafter, the third direction) of the deposition mask MSK.

FIG. 2 illustrates that each of the plurality of through-parts OP has a generally rectangular shape with rounded corners when viewed in plan, but is not limited thereto. The plurality of through-parts OP may have various shapes corresponding to the shape of the pattern to be deposited. For example, each of the plurality of through-parts OP may have a rectangular shape or a circular shape.

The widths of the plurality of through-parts OP may be determined corresponding to the shape of the pattern to be deposited. In an embodiment, the widths of the plurality of through-parts OP may be about 10 mm or more. The widths of the plurality of through-parts OP may be about 10 mm to about 400 mm. For example, when each of the plurality of through-parts OP has a rectangular shape with rounded corners, the short side of each of the plurality of through-parts OP may have a width of about 10 mm to about 150 mm, and the long side of each of the plurality of through-parts OP may have a width of about 40 mm to about 400 mm.

The mask body MB may be composed of a plurality of metals. The mask body MB may include iron and nickel. The mask body MB may include an alloy of iron and nickel.

The mask body MB may be formed of an alloy of iron and nickel. However, the embodiments are not limited thereto, and thus the mask body MB may include invar. In the alloy of iron and nickel, the nickel content may have a range of about 30 wt % to about 45 wt %. More specifically, in the alloy of iron and nickel, the content of nickel may have a range of about 33 wt % to about 42 wt %. The mask body MB may be an alloy containing nickel and having a coefficient of thermal expansion of about 5 ppm/° C. or less.

Referring to FIG. 2 and FIG. 3A together, the mask body MB according to an embodiment includes a first part MB1 and a second part MB2. As illustrated in FIG. 3A, the first part MB1 may be disposed in a lower portion of the mask body MB in the third direction DR3 which is the thickness direction of the mask body MB, and the second part MB2 may be disposed in an upper portion of the mask body MB in the third direction DR3. That is, the second part MB2 may be disposed on the first part MB1, as viewed in FIG. 3A.

A first through-part OP1 is defined in the first part MB1 and a second through-part OP2 is defined in the second part MB2. The first through-part OP1 and the second through-part OP2 are respectively defined along the third direction DR3 which is the thickness direction of the mask body MB, and the first through-part OP1 and the second through-part OP2 may be connected to define the through-part OP of the mask body MB.

The first through-part OP1 defined in the first part MB1 has a larger width than the second through-part OP2 defined in the second part MB2. The second through-part OP2 has a smaller width than the first through-part OP1, and thus the through-part OP of the mask body MB may be substantially defined through an end of the second through-part OP2. The width of each of the plurality of through-parts OP described above may be a width substantially defined by the end of the second through-part OP2. That is, the width W defined through the end of the second through-part OP2 may be about 10 mm or more. The width W defined through the end of the second through-part OP2 may be about 10 mm to about 400 mm.

The first through-part OP1 is defined by a first side surface LS1 of the first part MB1. The first side surface LS1 may have a rounded shape of which the slope changes toward the third direction DR3 which is the thickness direction of the mask body MB. As illustrated in FIG. 3A, the first side surface LS1 may have a rounded shape with a slope that decreases in a direction moving upwardly with respect to the top part MB2 in the third direction DR3 so the top of OP1 is wider than the bottom. The first side surface LS1 may have a rounded shape in which the slope increases in a direction moving downwards with respect to the second part MB2 along a thickness direction DR3 of the mask body MB The second through-part OP2 is defined by a second side surface LS2 of the second part MB2. The second side surface LS2 may be inclined at a predetermined taper angle θ along the third direction DR3, which is the thickness direction of the mask body MB. The taper angle θ may be an acute angle. That is, the second through-part OP2 may increase in size in a direction toward the upper portion along the third direction DR3. Accordingly, the width of the second part MB2 may increase in a direction moving downward with respect to the top part MB2 in the third direction DR3, which is the thickness direction of the mask body MB. The taper angle θ may be determined according to the characteristics of a laser that is emitted to form the through-part OP in the mask manufacturing process. In an embodiment, the taper angle θ may be about 30° to about 70°.

In an embodiment, the total thickness d1 of the mask body MB is about 50 micrometers to about 200 micrometers. To form a plurality of through-parts OP corresponding to each of the plurality of cell areas defined on the target substrate, and to form deposition patterns in the cell areas, the mask body MB may have a thickness d1 of about 50 micrometers to about 200 micrometers. When the thickness d1 of the mask body MB is less than about 50 micrometers, the durability of the deposition mask MSK to be used in the deposition process may be insufficient; and when the thickness d1 of the mask body MB is more than about 200 micrometers, the total thickness d1 of the deposition mask MSK increases, thereby making it difficult to form a plurality of through-parts OP, and lowering deposition precision when the deposition mask MSK is used in the deposition process.

As illustrated in FIG. 3A, when the first part MB1 is disposed in a lower portion of the mask body MB in the third direction DR3 that is the thickness direction of the mask body MB, and the second part MB2 is disposed in an upper portion of the mask body MB in the third direction DR3, the thickness d2 of the first part MB1 may be about 5% to about 50% of the total thickness d1 of the mask body MB. The thickness d3 of the second part MB2 may be more than about 50% to about 95% of the total thickness d1 of the mask body MB. The thickness d2 of the first part MB1 may be set to about 5% to about 50% of the total thickness d1 of the mask body MB so as to improve the manufacturing process yield of the deposition mask MSK, improve deposition precision and reduce or eliminate the occurrence of a shadow (i.e., a shadowing effect). When the thickness d2 of the first part MB1 is less than about 5% of the total thickness d1 of the mask body MB, the effect of increasing the manufacturing process yield of the deposition mask MSK may not be achieved. When the thickness d2 of the first part MB1 is more than about 50% of the total thickness d1 of the mask body MB, shadowing may excessively occur and deposition precision may be deteriorated when the deposition mask MSK is used in the deposition process.

The deposition mask MSK may be used in a process of forming, on a target substrate including a plurality of cell areas, a deposition pattern provided as a common layer in each of a plurality of cell areas. The mask body including metal and having a thickness of about 50 micrometers to about 200 micrometers includes the first part MB1 in which the first through-part OP1 is defined and the second part MB2 in which the second through-part OP2 is defined. Accordingly, while the time required for manufacturing the deposition mask MSK is reduced, deposition precision may be increased when the deposition mask MSK is used in a deposition process.

More specifically, the deposition mask MSK includes the first part MB1 having a rounded side surface formed through a wet-etching process, and the second part MB2 having a side surface which is inclined at a predetermined taper angle and is formed through laser irradiation. Through the wet-etching process, the thickness of the mask body MB decreases, thereby reducing the time required for the laser irradiation process while reducing the time required to form the deposition mask MSK. In addition, since the second through-part OP2, which substantially defines the through-part OP, is formed in the second part MB2 through laser irradiation, the deposition precision of the deposition mask may be improved and the occurrence of a shadow effect may be reduced or eliminated. Accordingly, dead spaces in a display panel manufactured through the deposition mask MSK may be reduced, and defects in the panel may be reduced as a result thereof.

Figure 3B:
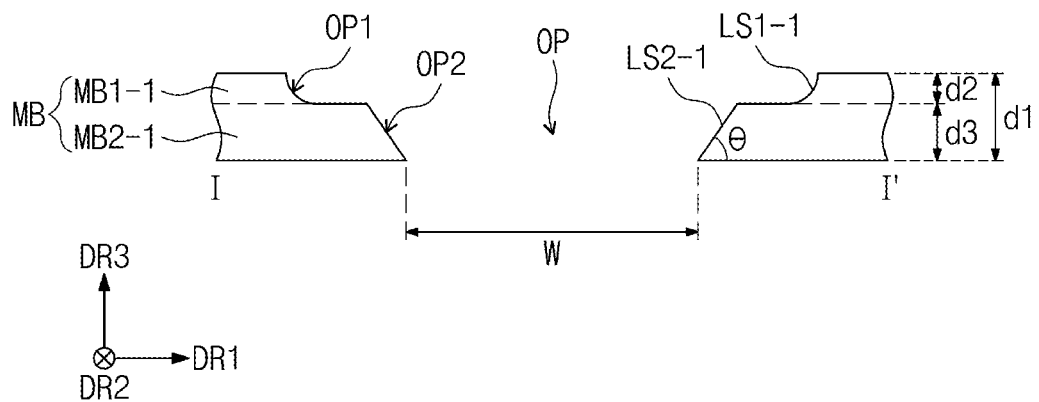
Figure 3C:
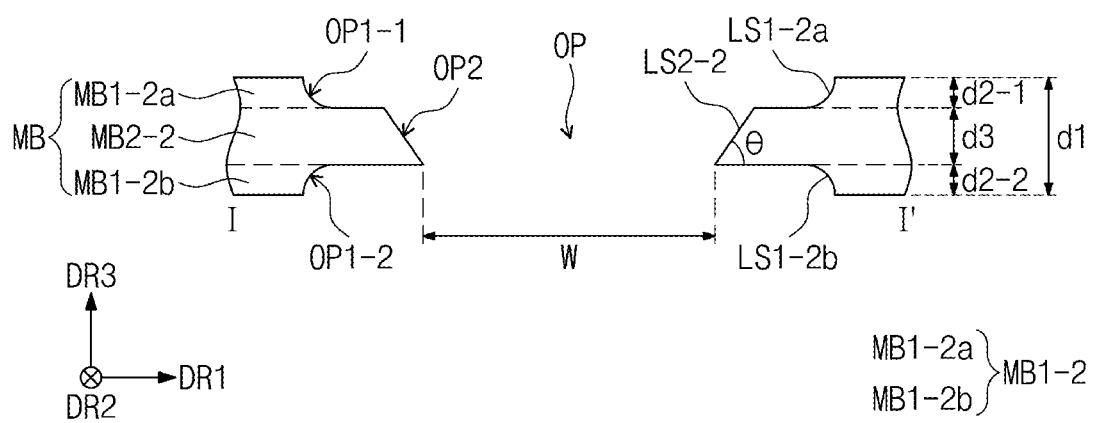

FIG. 3B and FIG. 3C are cross-sectional views of a deposition mask according to another embodiment. Similar to what is illustrated in FIG. 3A, FIG. 3B and FIG. 3C illustrate cross sections of a deposition mask according to other embodiments taken along line I-I' in FIG. 2. Hereinafter, in describing the deposition mask of an embodiment with reference to FIG. 3B and FIG. 3C, the same reference numerals are assigned to the aforesaid components, and detailed descriptions thereof are thus omitted herein to avoid redundancy.

Referring to FIG. 2 and FIG. 3B together, the mask body MB according to this embodiment includes a first part MB1-1 and a second part MB2-1, the first part MB1-1 is disposed in a upper portion of the mask body MB in the third direction DR3, which is the thickness direction, and the second part MB2-1 is disposed in a lower portion of the mask body MB in the third direction DR3. That is, the first part MB1-1 may be disposed on the second part MB2-1.

The first through-part OP1 is defined by a first side surface LS1-1 of the first part MB1-1, and the first side surface LS1-1 may have a rounded shape of which the slope changes toward the third direction DR3 which is the thickness direction of the mask body MB. As illustrated in FIG. 3B, the first side surface LS1-1 may have a rounded shape with a slope that increases moving upwardly in the third direction DR3. The first side surface LS1-1 may have a rounded shape in which the slope decreases toward the second part MB2-1.

The second through-part OP2 is defined by a second side surface LS2-1 of the second part MB2-1. The second side surface LS2-1 may be inclined at a predetermined taper angle θ along the third direction DR3, which is the thickness direction of the mask body MB. The taper angle θ may be an acute angle. In an embodiment, the taper angle θ may be about 30° to about 70°.

As illustrated in FIG. 3B, when the first part MB1-1 is disposed in the upper portion of the mask body MB in the third direction DR3, which is the thickness direction of the mask body MB, and the second part MB2-1 is disposed in the lower portion in the third direction DR3, the thickness d2 of the first part MB1-1 may be about 30% to about 80% of the total thickness d1 of the mask body MB. The thickness d3 of the second part MB2-1 may be more than about 20% and less than about 70% of the total thickness d1 of the mask body MB. The thickness d2 of the first part MB1-1 may be set to about 30% to about 80% of the total thickness d1 of the mask body MB to improve the manufacturing process yield of the deposition mask MSK, improve deposition precision and reduce or eliminate the occurrence of shadowing. When the thickness d2 of the first part MB1-1 is less than about 30% of the total thickness d1 of the mask body MB, the effect of increasing the manufacturing process yield of the deposition mask MSK may not be obtained. When the thickness d2 of the first part MB1-1 is more than about 80% of the total thickness d1 of the mask body MB, a shadowing effect may excessively occur, thereby lowering deposition precision when the deposition mask MSK is used in the deposition process.

Referring to FIG. 2 and FIG. 3C together, a mask body MB of this embodiment includes a first part MB1-2 and a second part MB2-2, and the first part MB1-2 may include a plurality of sub-parts MB1-2a and MB1-2b. Along the third direction DR3, which is the thickness direction of the mask body MB, the first part MB1-2 may include a first sub-part MB1-2a disposed in an upper portion of the second part MB2-2 and a second sub-part MB1-2b disposed in a lower portion of the second part MB2-2. That is, the first sub-part MB1-2a may be disposed on the second part MB2-2, and the second part MB2-2 may be disposed on the second sub-part MB1-2b. The second part MB2-2 may be disposed between the first sub-part MB1-2a and the second sub-part MB1-2b.

A first sub-through-part OP1-1 may be defined in the first sub-part MB1-1a, a second through-part OP2 may be defined in the second part MB2, and a second sub-through-part OP1-2 may be defined in the second sub-part MB1-2b. The first sub-through-part OP1-1, the second through-part OP2, and the second sub-through-part OP1-2 are each defined along the third direction DR3, which is the thickness direction of the mask body MB. The first sub-through-part OP1-1, the second through-part OP2, and the second sub-through-part OP1-2 may be combined to define the through-part OP of the mask body MB.

The first sub-through-part OP1-1 is defined by the first sub-side surface LS1-2a of the first sub-part MB1-2a, and the first sub-side surface LS1-2a may have a rounded shape with a slope that changes along the third direction DR3, which is the thickness direction of the mask body MB. The second sub-through-part OP1-2 is defined by the second sub-side surface LS1-2b of the second sub-part MB1-2b, and the second sub-side surface LS1-2b may include a rounded shape with a slope that changes along the third direction DR3, which is the thickness direction of the mask body MB. As illustrated in FIG. 3C, the first sub-side surface LS1-2a may have a rounded shape in which the slope increases moving upwardly in the third direction DR3, and the second sub-side surface LS1-2b may have a rounded shape in which the slope decreases moving downwardly in the third direction DR3. Each of the first sub-side surface LS1-2a and the second sub-side surface LS1-2b may have a rounded shape in which the slope decreases in a direction moving toward the second part MB2-2.

The second through-part OP2 is defined by the second side surface LS2-2 of the second part MB2-2. The second side surface LS2-2 may be inclined at a predetermined taper angle θ along the third direction DR3, which is the thickness direction of the mask body MB. The taper angle θ may be an acute angle. In an embodiment, the taper angle θ may be 30° to 70°.

As illustrated in FIG. 3C, when the first part MB1-2 includes the first sub-part MB1-2a disposed in the upper portion of the second part MB2-2 and the second sub-part MB1-2b disposed in the lower portion of the second part MB2-2, in the third direction DR3, which is the thickness direction of the mask body MB, the respective thicknesses d2-1 and d2-2 of the first sub-part MB1-2a and the second sub-part MB1-2b may be about 5% to about 40% of the total thickness d1 of the mask body MB. The thickness d2-1 of the first sub-part MB1-2a may be about 5% to about 40% of the total thickness d1 of the mask body MB, and the thickness d2-2 may be about 5% to about 40% of the total thickness d1 of the mask body MB. The combined thickness of the first sub-part MB1-2a and the second sub-part MB1-2b, that is, the total thickness d1 of the first part MB1-2 may be about 10% to about 80% of the total thickness d1 of the mask body MB. The respective thicknesses d2-1 and d2-2 of the first sub-part MB1-2a and the second sub-part MB1-2b included in the first part MB1-2 may be set to about 5% to about 40% of the total thickness d1 of the mask body MB to improve the manufacturing process yield of the deposition mask MSK, improve deposition precision and reduce or eliminate the occurrence of shadow. When the respective thicknesses d2-1 and d2-2 of the first and second sub-parts MB1-2a and MB1-2b are less than about 5% of the total thickness d1 of the mask body MB, the effect of improving the manufacturing process yield of the deposition mask MSK may not be readily achieved. When the respective thicknesses d2-1 and d2-2 of the first sub-part MB1-2a and the second sub-part MB1-2b are more than about 40% of the total thickness d1 of the mask body MB, shadowing may excessively occur, thereby lowering deposition precision when the deposition mask MSK is used in the deposition process.

Figure 5A:
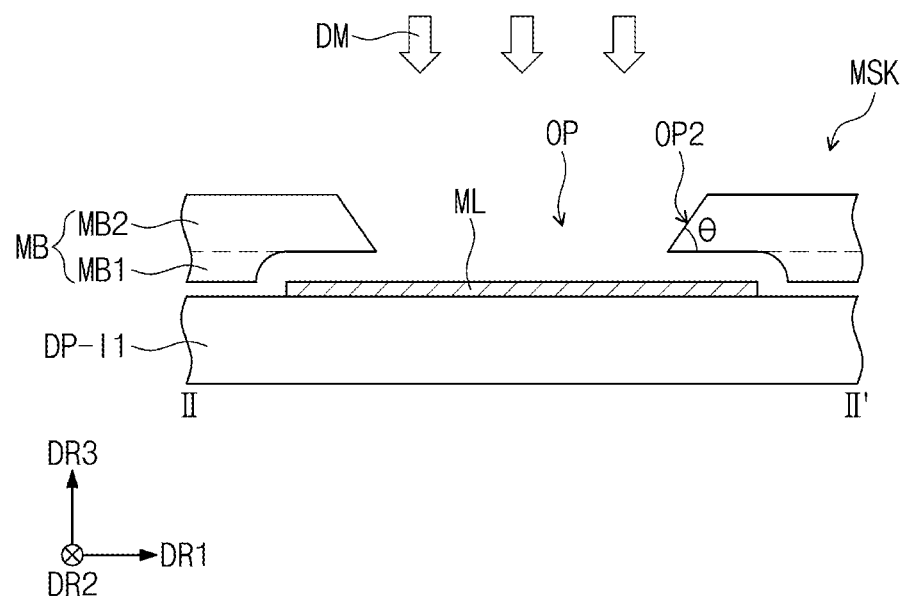
FIG. 5A and FIG. 5B are cross-sectional views taken along II-II' of FIG. 4B schematically illustrating some operations in an illustrative method of manufacturing a display panel using a deposition mask according to the principles of the invention.
Figure 5B:
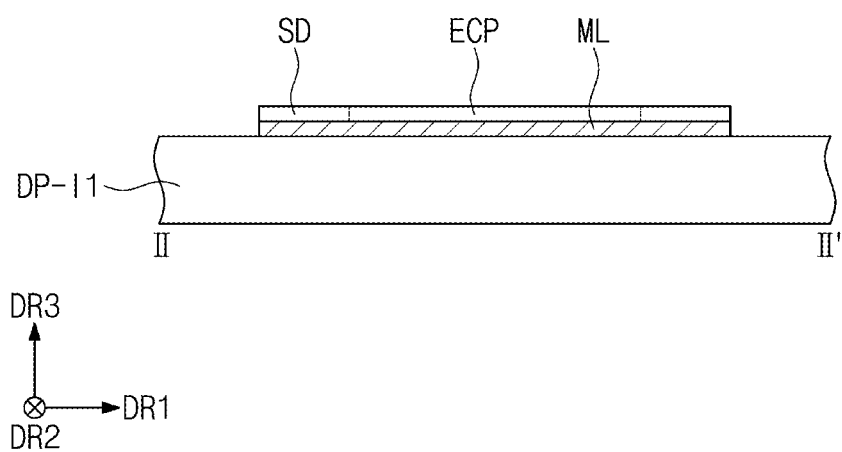
Figure 6A:
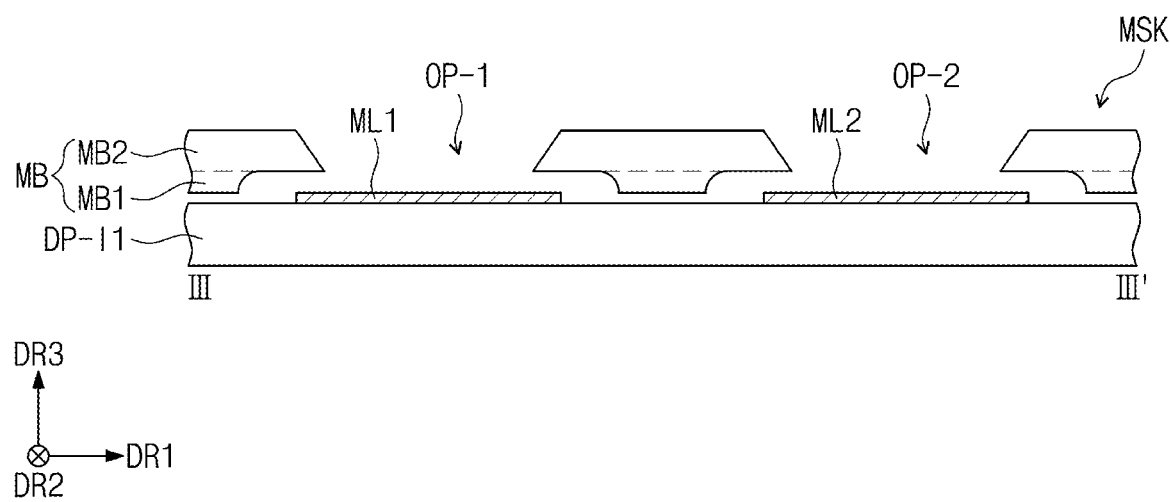
FIG. 6A and FIG. 6B are cross-sectional views taken along line of FIG. 4B illustrating some operations in an illustrative method of manufacturing a display panel using a deposition mask according to an embodiment.
Figure 6B:
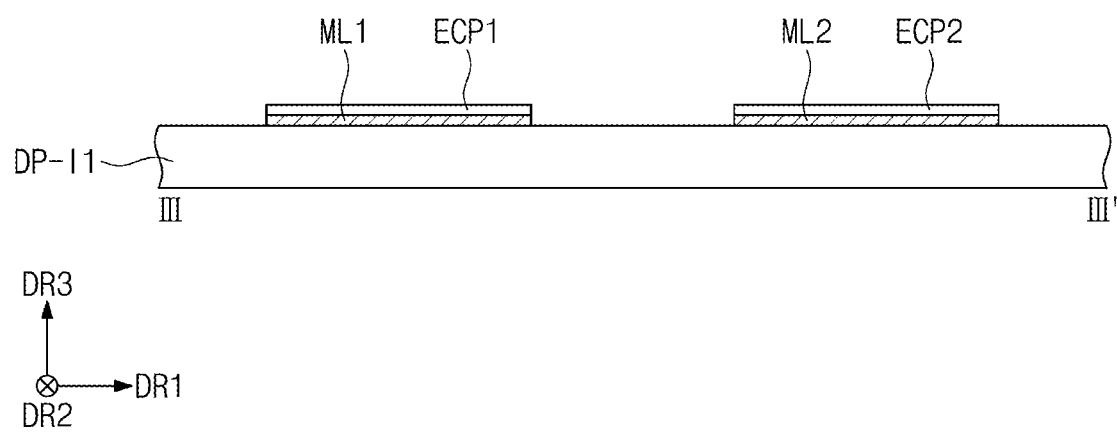

FIG. 4A to 4E are perspective views schematically illustrating an illustrative method of manufacturing a display panel using a deposition mask according to principles of the invention. FIG. 4F is a cross-sectional view schematically illustrating a display panel manufactured using a deposition mask constructed according to principles of the invention. FIGS. 5A and 5B are cross-sectional views schematically illustrating some operations of a method of manufacturing a display panel using a deposition mask constructed according principles of the invention. FIGS. 6A and 6B are cross-sectional views schematically illustrating some operations of a method of manufacturing a display panel using a deposition mask according to an embodiment. FIGS. 5A and 5B are cross-sectional views taken along II-II' of FIG. 4B. FIGS. 6A and 6B are cross-sectional views taken along line of FIG. 4B. Meanwhile, the same reference numerals are assigned to the same components as those illustrated in FIGS. 1 to 3C, and duplicate descriptions thereof are thus omitted herein to avoid redundancy.

Figure 4A:
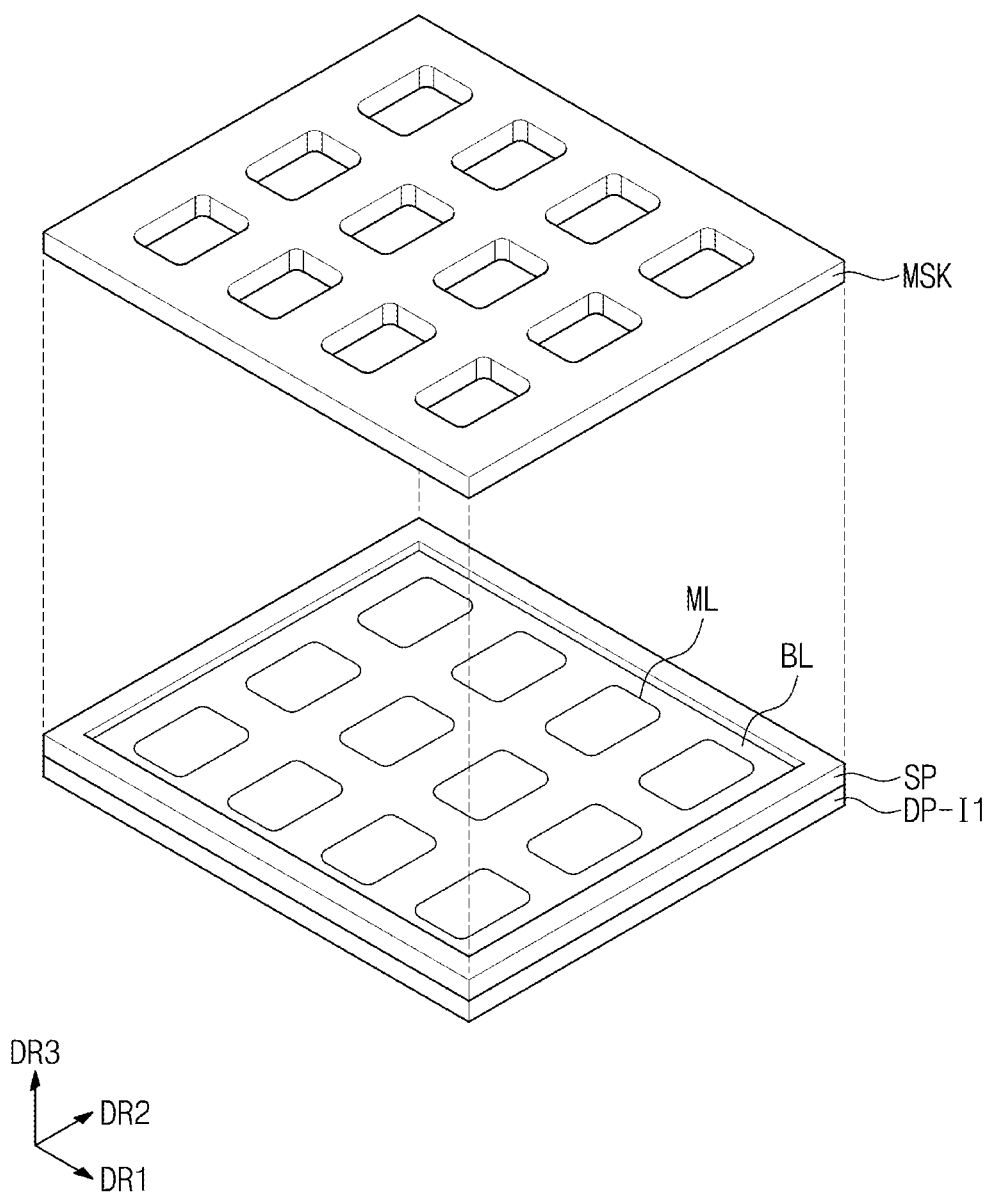
FIGS. 4A, 4B, 4C, 4D, and 4E are perspective views schematically illustrating an illustrative method of manufacturing a display panel using a deposition mask constructed according to the principles of the invention.
Figure 4B:
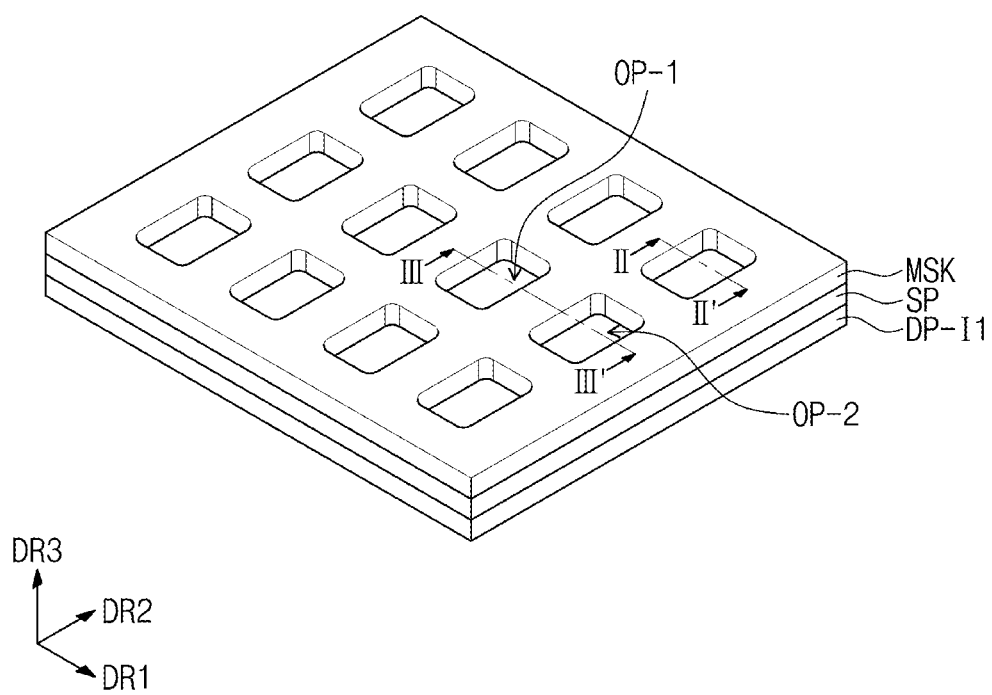

As illustrated in FIG. 4A and FIG. 4B, a deposition mask MSK is disposed on a target substrate DP-I1. In the illustrated embodiment, the deposition mask MSK is illustrated to include a plurality of through-parts arranged along the first direction DR1 and the second direction DR2. However, the embodiments are not limited thereto, and the through-part of the deposition mask MSK may have various shapes and arrangements. In addition, FIG. 4A and FIG. 4B are illustrative of one deposition mask MSK disposed on the target substrate DP-I1, but a plurality of deposition masks MSK may be disposed on the target substrate DP-I1 in alternative implementations.

Further, according to the embodiment shown in FIGS. 4A and 4B, a support SP may be further disposed between the deposition mask MSK and the target substrate DP-I1. The support SP may be provided in a frame shape exposing at least a part of the target substrate DP-I1. However, the embodiments are not limited thereto, and the support SP may be disposed without limitation as long as the support SP overlaps the remaining area except for the through-part of the deposition mask MSK. The deposition mask MSK may be integrally provided by being coupled to the support SP. In the embodiment described herein, the support SP may prevent direct contact between the masks MSK and the target substrate DP-I1. Accordingly, damage to the target substrate DP-I1 due to contact with the masks MSK may be prevented. However, this configuration is illustrated as an example. Therefore, in the method of manufacturing a display panel according to an embodiment, the support SP may be omitted and the masks MSK may be disposed directly on the target substrate DP-I1, but the embodiments are not limited thereto. The support SP may include a metal, and for example, the support SP may include a metal having a thermal expansion coefficient of 5 ppm/° C. or less.

A part of the target substrate DP-I1 exposed by the support SP may overlap an area in which the through-part OP of the deposition mask MSK is defined. A plurality of cell areas in which a plurality of circuit element layers ML are respectively formed are defined on the target substrate DP-I1, the deposition mask may be disposed so that the cell areas in which the plurality of circuit element layers ML are formed on the target substrate DP-I1 overlap an area in which the through-part OP of the deposition mask MSK is defined.

Figure 4C:
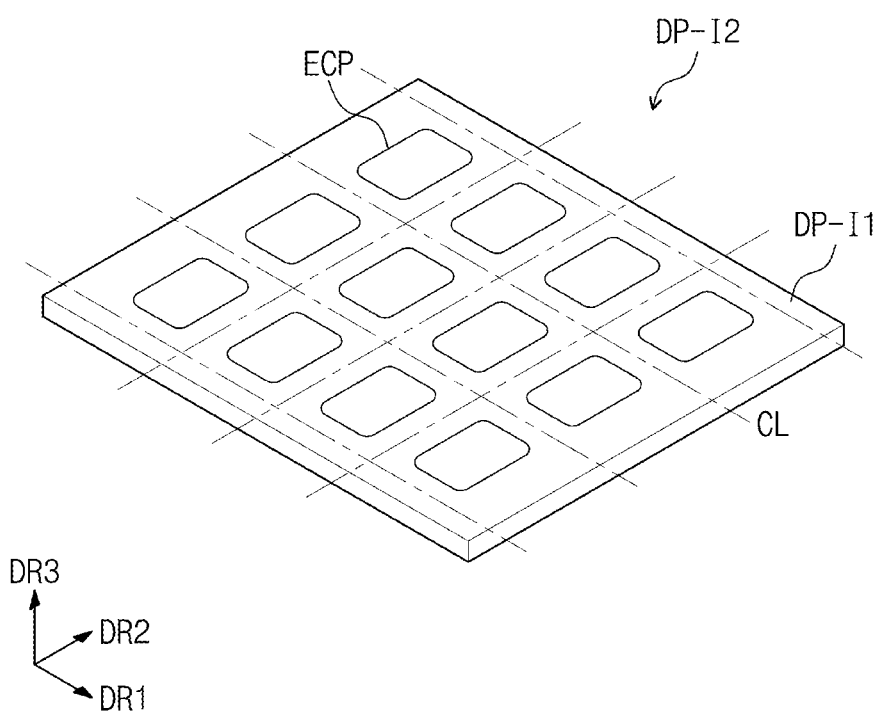

Referring to FIG. 4C, after the deposition mask MSK is disposed on the target substrate DP-I1, a plurality of deposition patterns ECP are formed through a deposition process in an area corresponding to the through-part of the deposition mask MSK, and thereafter, the deposition mask MSK is removed. The target substrate DP-I2 from which the deposition mask MSK has been removed may be in a state in which the plurality of deposition patterns ECP are formed on the target substrate DP-I1. The plurality of deposition patterns ECP may be formed to correspond to the through-parts OP of the deposition mask MSK. The embodiment of FIG. 4C illustrates that 12 deposition patterns ECP are spaced apart from each other. Each of the plurality of deposition patterns ECP may include a plurality of inorganic layers and one organic layer, and the inorganic layers and the organic layer included in the plurality of deposition patterns ECP may be formed to respectively correspond to the through-parts OP. As described above, the plurality of deposition patterns ECP may be a common layer among the components included in a display element layer EL (FIG. 1). That is, the plurality of deposition patterns ECP may be at least one of a hole control layer HCL, an electronic control layer ECL, a cathode CE, or an optical control layer CPL. Alternatively, the plurality of deposition patterns ECP disposed on the display element layer EL (see FIG. 1) may be a thin-film encapsulation layer TFE (see FIG. 1). However, the embodiments are not limited thereto, and a component, which is among the components included in the display panel DP (see FIG. 1), and is provided as a common layer rather than a component patterned for each individual pixel, may correspond, without limitation, to the plurality of deposition patterns ECPt.

Figure 4D:
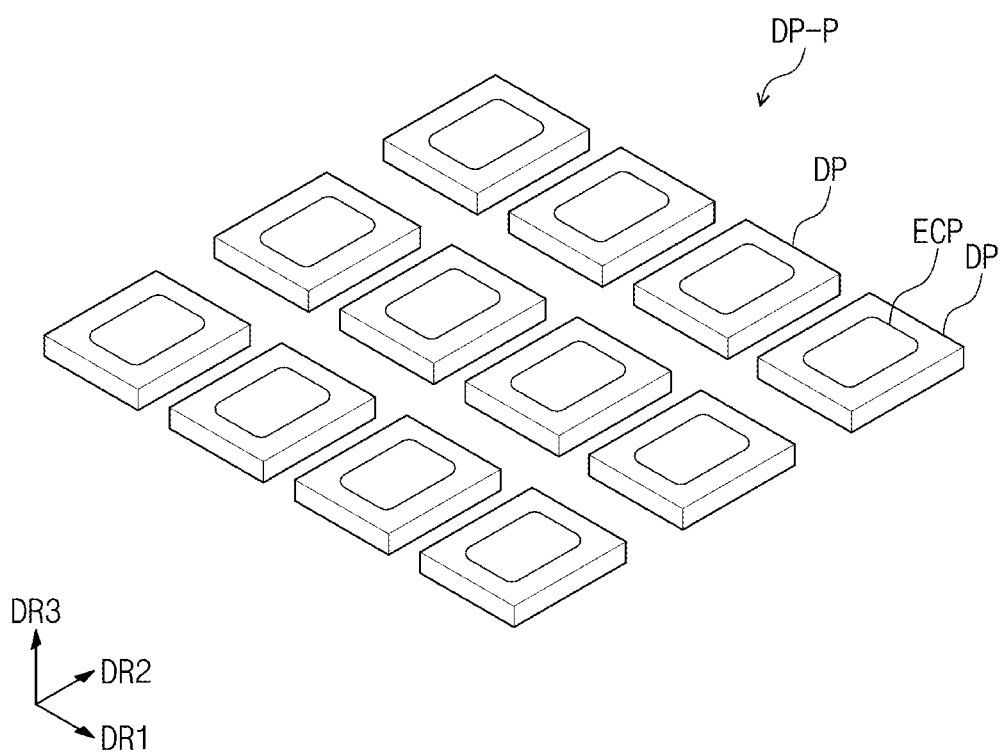

Referring to FIG. 4C and FIG. 4D, the target substrate DP-I2 from which the deposition mask MSK is removed is cut along the defined cutting lines CL and separated into a plurality of panels DP-P. Each of the panels DP-P forms a display panel DP.

According to an embodiment, a plurality of display panels DP-P may be formed by patterning one target substrate DP-I1, so that a process time may be shortened and a process cost may be reduced. However, this configuration is illustrated as an example, and according to an embodiment, a single display panel DP may be provided from the target substrate DP-I1 depending on the size of the display panel DP, and number of display panels DP is not limited to any one embodiment.

Figure 4E:
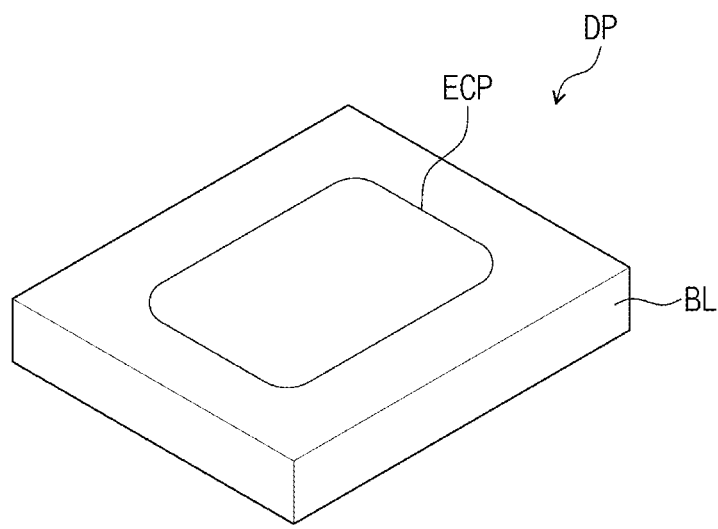
Figure 4F:
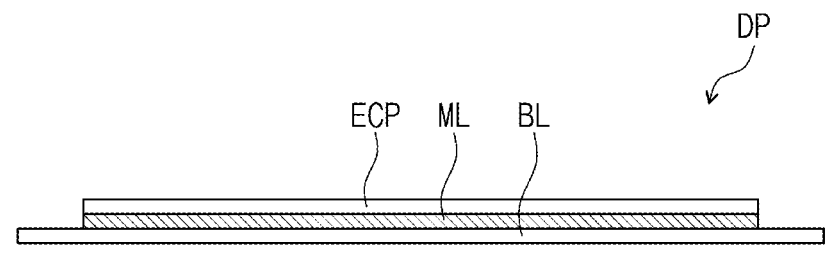
FIG. 4F is a cross-sectional view schematically illustrating an embodiment of a display panel manufactured using a deposition mask constructed according to principles of the invention.
Figure 4F:
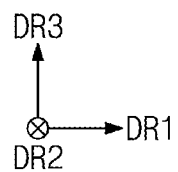

Referring to FIG. 4E and FIG. 4F, a display panel DP includes a base layer BL and a deposition pattern ECP disposed on the base layer BL. The deposition pattern ECP may be disposed on the circuit element layer ML disposed on the base layer BL. The detailed configurations of the base layer BL and the circuit element layer ML may be the same as those described in FIG. 1.

Hereinafter, a process of forming a deposition pattern according to an embodiment will be described with reference to FIGS. 5A, 5B, 6A, and 6B.

FIG. 5A illustrates a cross-sectional view corresponding to the target substrate DP-I1 illustrated in FIG. 4A and FIG. 4B. Referring to FIG. 5A, the target substrate DP-I1 may include a base layer BL and a circuit element layer ML. In the illustrated embodiment, for ease in explanation, a stacked structure of the circuit element layer ML is schematically illustrated, but other types of configurations are contemplated in alternative implementations.

The base layer BL may include a plastic substrate, a glass substrate, a metal substrate, etc. The plastic substrate contains resin. For example, the base layer BL may include at least one of acrylic resin, methacrylic resin, polyisoprene, vinyl resin, epoxy resin, urethane resin, cellulose resin, siloxane resin, polyimide resin, polyamide resin or perylene resin.

The circuit element layer ML may include a plurality of insulating layers and at least one transistor.

FIG. 5A and FIG. 6A illustrate that the deposition mask MSK is disposed spaced apart from the target substrate DP-I1 by a predetermined interval. However, the embodiments are not limited thereto, and the deposition mask MSK may be disposed to contact the target substrate DP-I1. In addition, FIG. 5A and FIG. 6A illustrate an embodiment of the deposition mask MSK illustrated in FIG. 3A used in a manufacturing process for forming a component on a wafer or a substrate. However, the embodiments are not limited thereto. For example, and the deposition mask of the embodiment illustrated in FIGS. 3B and 3C may be used in the deposition process.

When the deposition mask MSK is disposed on the target substrate DP-I1, the deposition mask MSK may be disposed such that an angle formed by the taper angle θ formed by the second part MB2 of the mask body MB and the upper surface of the target substrate DP-I1 becomes an acute angle. That is, the deposition mask MSK may be disposed on the target substrate DP-I1 so that the width of the second opening OP2 increases along a direction away from the upper surface of the target substrate DP-I1.

The through-part OP of the deposition mask MSK may be disposed to overlap the circuit element layer ML in a plane. The width of the through-part OP may substantially correspond to the width of the second through-part OP2 defined in the second part MB2 of the deposition mask MSK.

Referring to FIG. 5A and FIG. 5B, in the method of manufacturing a display panel according to this embodiment, the deposition pattern ECP is formed through the deposition material DM in an area corresponding to the through-part OP of the deposition mask MSK. The deposition pattern ECP may be formed on the circuit element layer ML. The deposition pattern ECP may be a common layer formed on the circuit element layer ML, that is, a hole control layer, an electronic control layer, and a cathode. Alternatively, the deposition pattern ECP may be a thin-film encapsulation layer disposed on the display element layer.

The deposition material DM may include an organic material and an inorganic material. The deposition material DM may include a plurality of organic materials and a plurality of inorganic materials according to the stacked structure of the deposition pattern ECP. When the deposition pattern ECP is a hole control layer, the deposition material DM may include a hole injection material or a hole transport material; and when the deposition pattern ECP is an electron control layer, the deposition material DM may include an electron injection material or an electron transport material. When the deposition pattern ECP is a cathode, the deposition material DM may include a plurality of metals or metal oxides. When the deposition pattern ECP is a thin-film encapsulation layer, the deposition pattern ECP includes two inorganic layers and one organic layer disposed therebetween, and the deposition material DM may be one in which a first inorganic material, an organic material, and a second inorganic material are alternately provided to correspond to the stacked structure.

The deposition pattern ECP may be formed by depositing the deposition material DM through various deposition methods. In an embodiment, the deposition pattern ECP may be obtained through deposition using a chemical vapor deposition (CVD) method.

Referring to FIG. 6A and FIG. 6B, the circuit element layers ML1 and ML2 may include, on the base layer BL, a first circuit element layer ML1 and a second circuit element layer ML2 spaced apart from each other in the first direction DR1.

In the illustrated embodiment shown in FIG. 6A and FIG. 6B, the through-parts OP-1 and OP-2 of the deposition mask MSK may be disposed to respectively overlap the circuit element layers ML1 and ML2 when viewed in plan. A plurality of through-parts OP-1 and OP-2 are defined in the deposition mask MSK, and the plurality of through-parts OP-1 and OP-2 may be disposed to respectively overlap the plurality of circuit element layers ML1 and ML2 when viewed in plan. In FIG. 6A, a first through-part OP-1 overlapping the first circuit element layer ML1 and a second through-part OP-2 overlapping the second circuit element layer ML2 may be defined in the deposition mask.

Referring still to FIG. 6A and FIG. 6B, in a method of manufacturing a display panel according to an embodiment, a plurality of deposition patterns ECP1 and ECP2 are formed using the deposition material DM in an area corresponding to the through-parts OP-1 and OP-2 of the deposition mask MSK. The plurality of deposition patterns ECP1 and ECP2 may be formed to be disposed on the plurality of circuit element layers ML1 and ML2. In the method of manufacturing a display panel according to this embodiment, by depositing the deposition material DM in an area corresponding to the through-parts OP-1 and OP-2 of the deposition mask MSK, the first deposition pattern ECP1 disposed on the first circuit element layer ML1 is formed, and the second deposition pattern ECP2 disposed on the second circuit element layer ML2 may be formed.

Referring again to FIG. 5B, during formation of the deposition pattern ECP, a shadow SD may be formed by depositing the deposition material in an area overlapping the lower portion of the deposition mask MSK other than in an area corresponding to the through-part OP of the deposition mask MSK, and more specifically, in an area corresponding to the second through-part OP2 of the deposition mask MSK. When the shadows SD of the deposition pattern ECP is formed in a large area, the shadows SD of the adjacent deposition patterns (ECP1, ECP2, see FIG. 6B) may come into contact with each other, resulting in defects such as shorts or cracks. Due to the shadow SD that is formed in an area other than the area where the deposition pattern ECP is to be formed, for example, on a component such as a pad included in the display panel, a defect in the display panel may occur. In addition, in a process of cutting the target substrate illustrated in FIG. 4C and FIG. 4D, defects such as film removal or cracking may occur when the shadows SD in contact with each other are cut.

In the method of manufacturing a display panel according to the principles and embodiments of the invention, the range in which the shadow SD is formed may be reduced since the deposition mask MSK used in the deposition process includes the first part MB1 formed through wet-etching and the second part MB2 formed through laser irradiation. In particular, since the first part MB1 is formed through wet-etching to reduce the time required for the overall formation process for the deposition mask MSK and the second part MB2 is formed to have at least predetermined thickness through laser irradiation to reduce the shadow-formed range and improve deposition precision, thereby reducing or preventing defects occurring in the display panel, and improving process reliability.

Figure 7A:
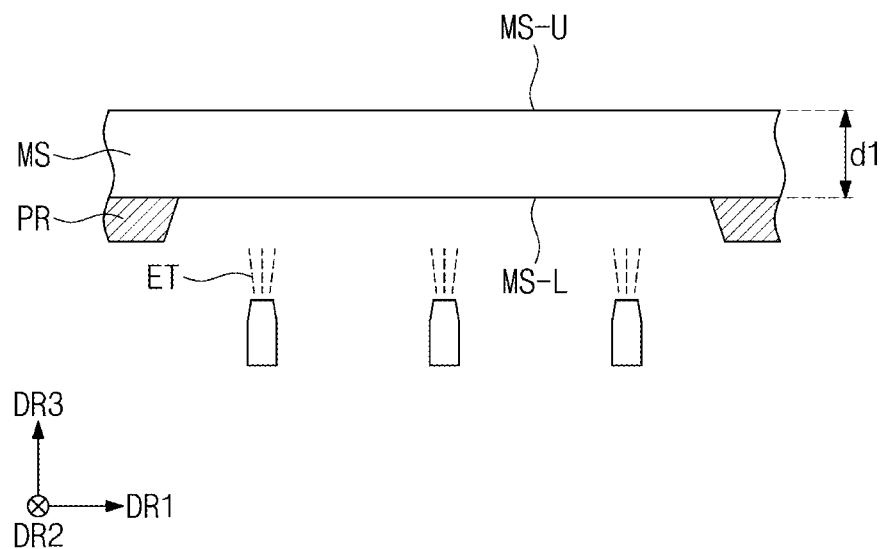
FIGS. 7A, 7B, and 7C are perspective views sequentially illustrating some operations in an illustrative method of manufacturing a deposition mask according to an embodiment.
Figure 7B:
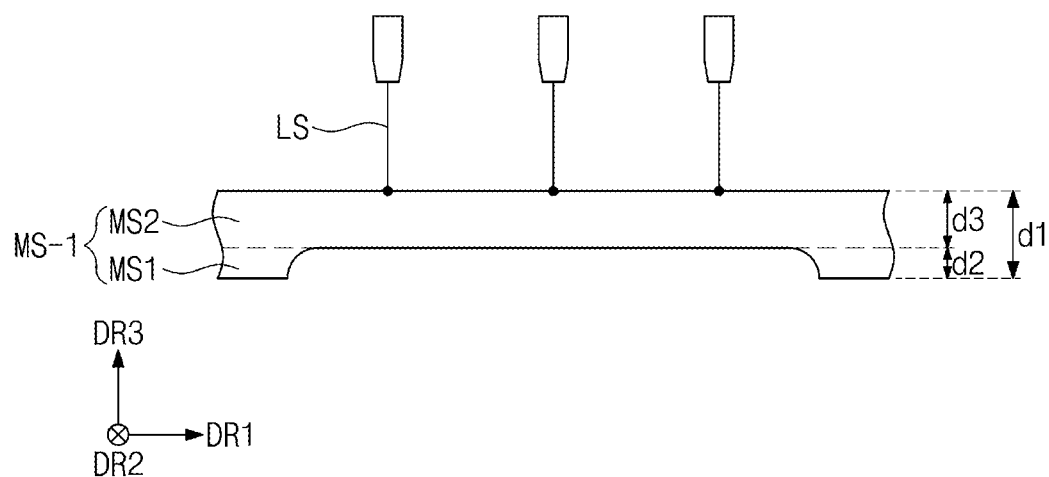
Figure 7C:
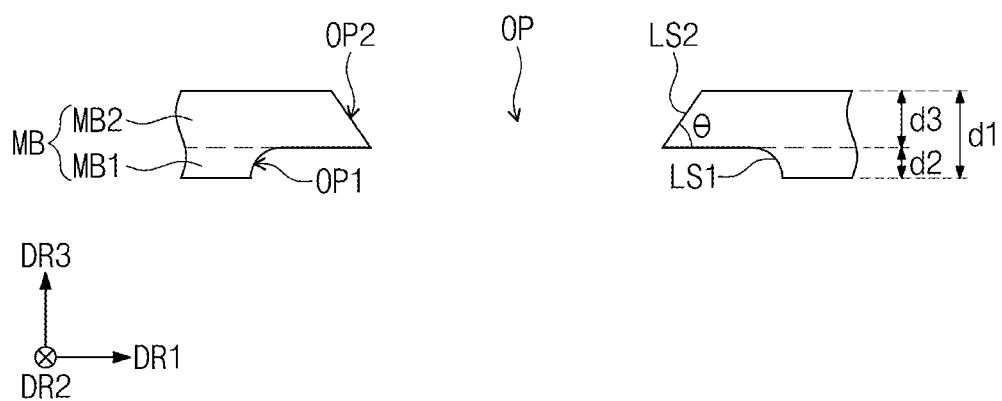

FIGS. 7A to 7C are perspective views sequentially illustrating some operations of a method of manufacturing a deposition mask according to an embodiment.

As illustrated in FIG. 7A, the method of manufacturing a deposition mask according to an embodiment includes preparing a base sheet MS having a thickness d1 of about 50 micrometers to 200 micrometers. The base sheet MS may include iron and nickel. The base sheet MS may be formed through an alloy of iron and nickel. The base sheet MS may include invar. In an embodiment, the base sheet MS may be formed by cutting a metal thin film formed of invar into a predetermined size.

As illustrated in FIG. 7A and FIG. 7B, the method of manufacturing a deposition mask according to an embodiment includes reducing the thickness of the base sheet MS by wet-etching at least one surface of the base sheet MS. In an embodiment, the base sheet MS includes an upper surface MS-U and a lower surface MS-L, and an etchant ET may be provided onto the lower surface of the base sheet MS to form a processed base sheet MS-1 having a reduced thickness. In providing the etchant ET onto the lower surface MS-L of the base sheet MS, the photoresist pattern PR is formed to prevent a part other than the part to which the etchant ET is to be provided, from being etched. In alternative implementations, the photoresist pattern PR may also be disposed on the entire upper surface MS-U of the base sheet MS.

The processed base sheet MS-1, of which the thickness has been reduced through the etchant ET, may include a first sheet part MS1 and a second sheet part MS2. The first sheet part MS1 may be a part in which at least a portion of the first sheet part MS1 is etched through the etchant ET. The second sheet part MS2 may be a part that has not been etched during the etching process using the etchant ET. In an embodiment illustrated in FIG. 7A and FIG. 7B, the thickness d2 of the first sheet part MS1 may be about 5% to about 50% of the total thickness d1 of the base sheet MS. The thickness d3 of the second sheet part MS2 may be more than about 50% and smaller than 95% of the total thickness d1 of the base sheet MS. When the thickness d2 of the first sheet part MS1 is less than about 5% of the total thickness d1 of the base sheet MS, the effect of increasing the yield of the deposition mask manufacturing process may not be secured. When the thickness d2 of the first sheet part MS1 is more than about 50% of the total thickness d1 of the base sheet MS, the shadow in the deposition mask formed through the manufacturing process may excessively occur, thereby deteriorating deposition precision when the deposition mask is used in the deposition process.

As illustrated in FIGS. 7A to 7C, the method includes forming the through-part OP by irradiating, with laser LS from the upper surface MS-U, the processed base sheet MS-1 subjected to the thickness reduction treatment. A portion of the part of the processed base sheet MS-1 of which the thickness has been reduced by the etchant ET is irradiated with the laser LS. Since the processed base sheet MS-1 subjected to the thickness reduction treatment is patterned using the laser LS to form the through-part OP in the deposition mask manufacturing method according to an embodiment, the laser LS processing time may be reduced, thereby reducing the time and cost of the deposition mask manufacturing process. Through the laser LS irradiation process, the second through-part OP2 may be formed to include the second side surface LS2 having a predetermined taper angle θ.

In the method of manufacturing a deposition mask according to an embodiment, after performing, on the base sheet, the thickness reduction treatment using an etchant, a through-part is formed through laser irradiation. Through this, the laser processing time may be reduced, and thus the time and cost for the deposition mask manufacturing process may be reduced. In addition, by limiting the thickness to be reduced through the etchant ET to a predetermined ratio, it is possible to ensure the thickness formed through laser irradiation to a predetermined thickness or more. Accordingly, the occurrence of shadowing may be reduced or prevented and a deposition mask with improved deposition precision may be manufactured as a result thereof.

Figure 8A:
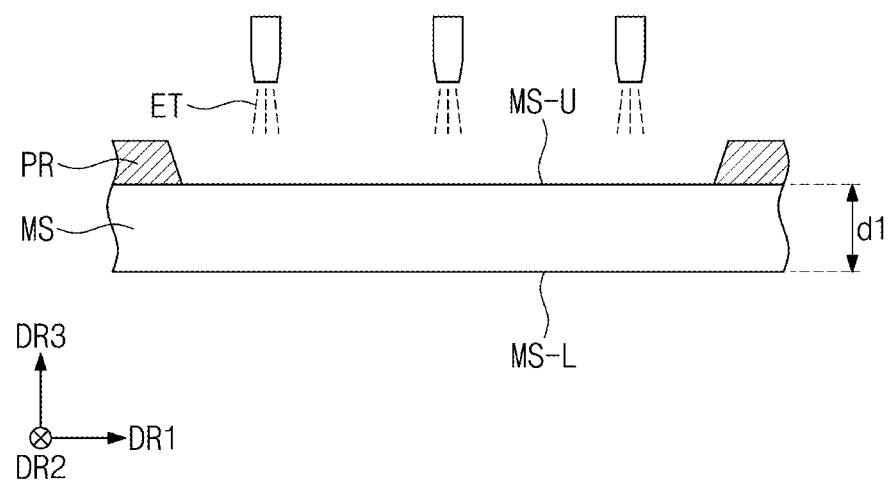
FIGS. 8A, 8B, and 8C are perspective views sequentially illustrating some operations in an illustrative method of manufacturing a deposition mask according to an embodiment.
Figure 8B:
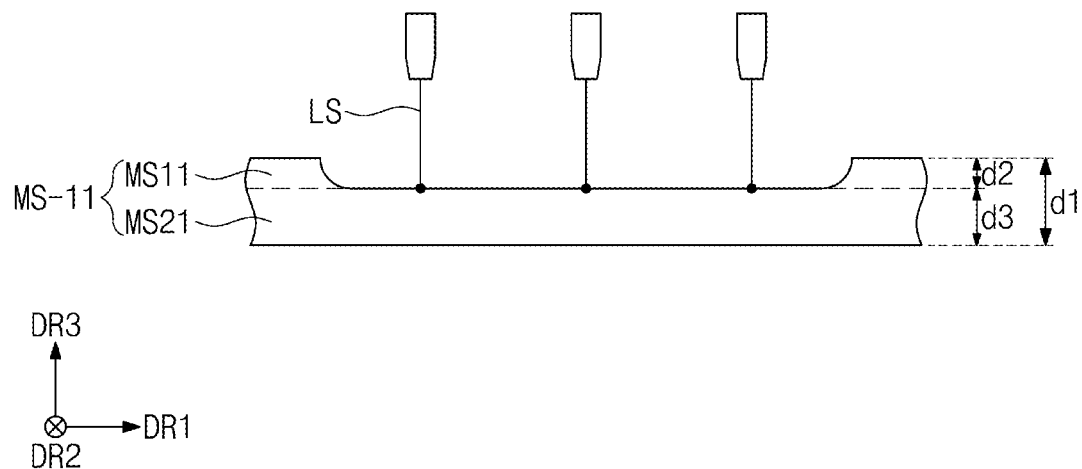
Figure 8C:
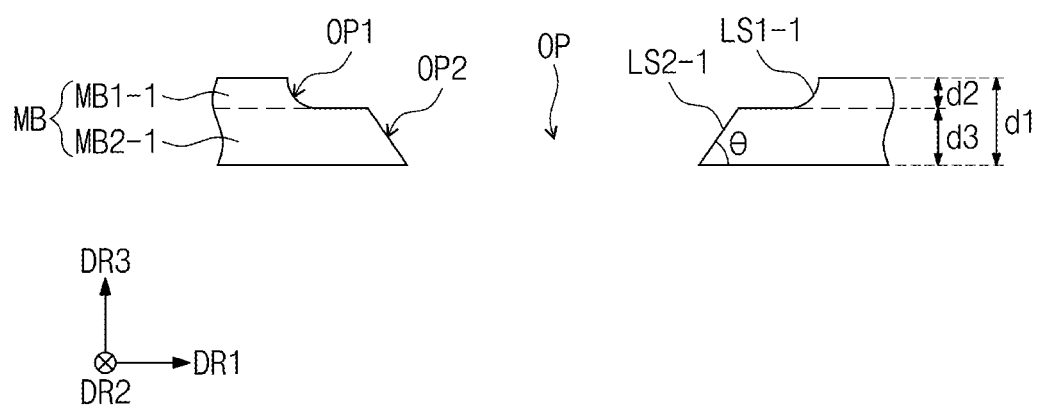
Figure 9A:
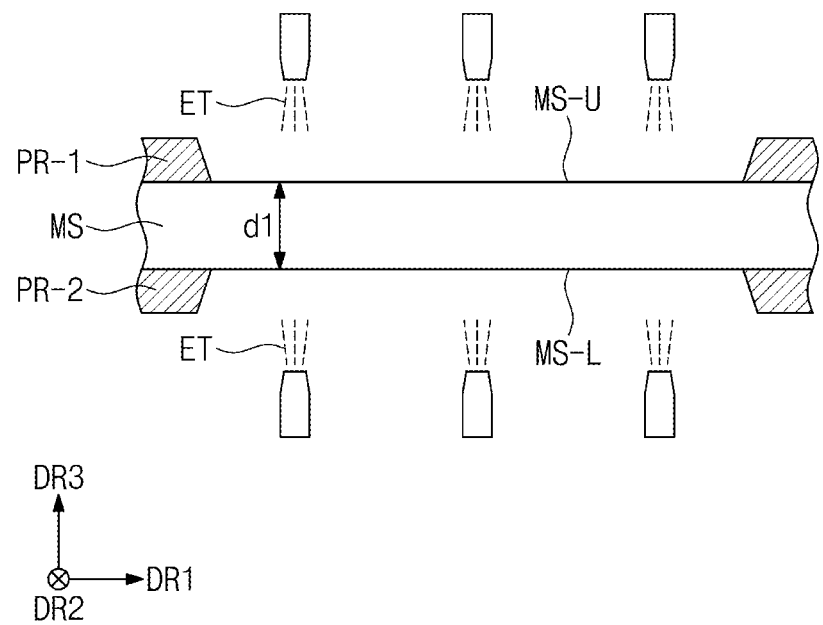
FIGS. 9A, 9B, and 9C are perspective views sequentially illustrating some operations in an illustrative method of manufacturing a deposition mask according to an embodiment.
Figure 9B:
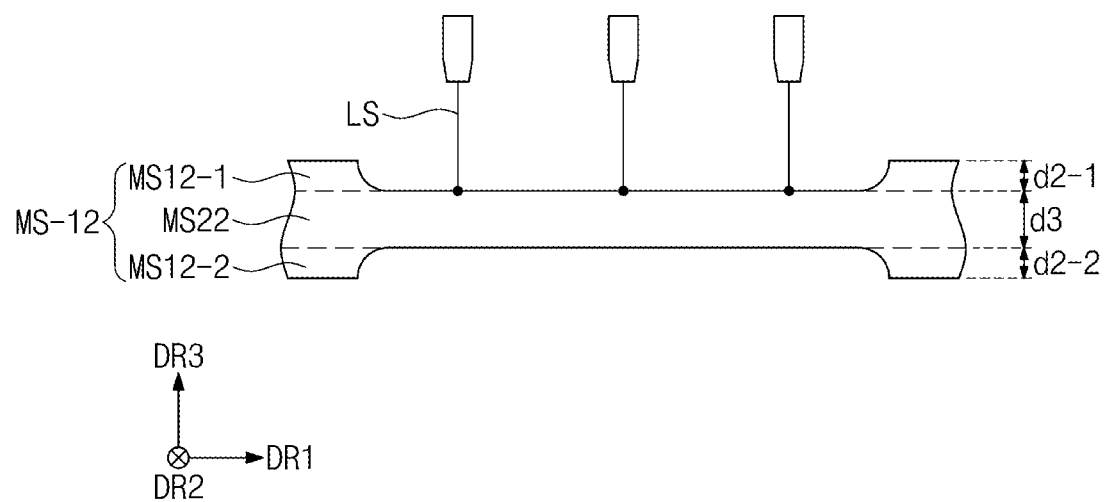
Figure 9C:
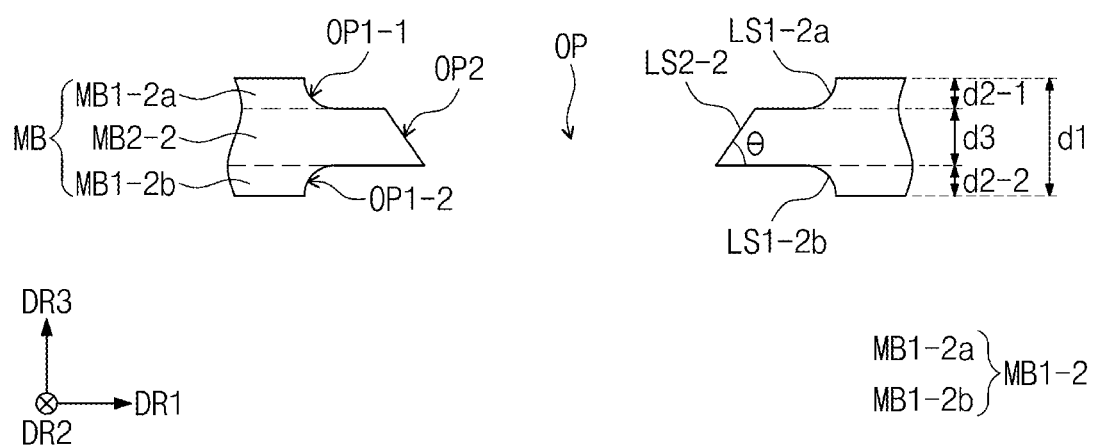

FIGS. 8A to 8C are perspective views sequentially illustrating some operations of a method of manufacturing a deposition mask according to another embodiment. FIGS. 9A to 9C are perspective views sequentially illustrating some operations of a method of manufacturing a deposition mask according to another embodiment. Hereinafter, in describing a method of manufacturing a deposition mask according to embodiments with reference to FIGS. 8A to 8C and FIGS. 9A to 9C, the same reference numerals are assigned to the same components as those described above, and detailed descriptions thereof are thus omitted herein to avoid redundancy.

Referring to FIGS. 8A to 8C, in reducing the thickness of the base sheet MS by wet-etching at least one surface of the base sheet MS, an etchant ET is provided onto the upper surface MS-U of the base sheet MS to form a processed base sheet MS with a reduced thickness, and a through-part OP is formed by irradiating with a laser LS from the upper surface MS-U. In providing the etchant ET onto the upper surface MS-U of the base sheet MS, the photoresist pattern PR is formed to prevent a part other than the part where the etchant ET is to be provided. The photoresist pattern PR may be disposed on the entire lower surface MS-L of the base sheet MS.

The processed base sheet MS-11 subjected to the thickness reduction treatment through the etchant ET may include a first sheet part MS11 and a second sheet part MS21. The first sheet part MS11 may be a part in which at least a portion of the first sheet part MS11 is etched through the etchant ET. The second sheet part MS21 may be a part that is not etched in an etching process using the etchant ET. In the embodiment illustrated in FIG. 8A and FIG. 8B, the thickness d2 of the first sheet part MS11 may be about 30% to about 80% of the total thickness d1 of the base sheet MS. The thickness d3 of the second sheet part MS21 may be more than about 20% and less than about 70% of the total thickness d1 of the base sheet MS. When the thickness d2 of the first sheet part MS11 is less than about 30% of the total thickness d1 of the base sheet MS, the effect of increasing the manufacturing process yield of the deposition mask may not be achieved. When the thickness of the first sheet part is more than about 80% of the total thickness d1 of the base sheet, the shadow of the deposition mask formed through the manufacturing process may excessively occur, thereby lowering deposition precision when the deposition mask is used in the deposition process.

Referring to FIGS. 9A to 9C, in reducing the thickness of the base sheet MS by wet-etching at least one surface of the base sheet MS, the etchant is provided onto both the upper surface MS-U and the lower surfaces MS-L of the base sheet MS to form a processed base sheet MS having a reduced thickness, and then a through-part may be formed by irradiating with a laser from the upper surface direction. In providing the etchant ET to the upper surface MS-U and the lower surface MS-L of the base sheet MS, the photoresist pattern PR is formed to prevent a part other than the part where the etchant ET is to be provided.

The processed base sheet MS-12, which has been subjected to the thickness reduction treatment using the etchant ET, may include a first sub-sheet part MS12-1, a second sub-sheet part MS12-2, and a second sheet part MS21. The first sub-sheet part MS12-1 and the second sub-sheet part MS12-2 may be at least partially etched through the etchant ET. The second sheet part MS22 may be a part that has not been etched in an etching process using the etchant ET. In the embodiment illustrated in FIG. 9A and FIG. 9B, the respective thicknesses d2-1 and d2-2 of the first sub-sheet parts MS12-1 and second sub-sheet parts MS12-2 may be about 5% to about 40% of the total thickness d1 of the base sheet MS. A part corresponding to the sum of the thicknesses (d2-1, d2-2) of the first sub-sheet part MS12-1 and the second sub-sheet part MS12-2, that is, a thickness reduced through an etchant ET treatment, may be about 10% to about 80%. When the respective thicknesses (d2-1, d2-2) of the first sub-sheet part MS12-1 and the second sub-sheet part MS12-2 are less than about 5% of the total thickness d1 of the base sheet MS, the effect of improving the manufacturing process yield of the deposition mask may not be achieved. When the respective thicknesses (d2-1, d2-2) of the first sub-sheet part MS12-1 and the second sub-sheet part MS12-2 are more than about 40% of the total thickness d1 of the base sheet MS, shadowing in the deposition mask formed through the manufacturing process may excessively occur, thereby lowering deposition precision when the deposition mask is used in the deposition process.

According to the principles and embodiments of the invention, the laser irradiation process time for forming a through-part defined in a deposition mask may be reduced, so that the time and cost for a deposition mask manufacturing process may be reduced. In addition, during a deposition process using the deposition mask, shadowing may be reduced or prevented from being widely formed to thereby improve the deposition precision. Accordingly, defects in a display panel formed by using the deposition mask made according to the principles and embodiments of the invention may be reduced or prevented.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A deposition mask for manufacturing a display panel, the deposition mask comprising:
 a metallic base having a thickness of about 50 micrometers to about 200 micrometers and a plurality of openings defined therein;
 wherein at least some of the plurality of openings include a first opening having a first width and a second opening having a second width smaller than the first width respectively defined along a thickness direction of the metallic base, and
 wherein the metallic base includes a first part in which the first opening is defined, and a second part in which the second opening is defined, the second part having a width that increases in a direction downward from a top surface of the metallic base along the thickness direction of the metallic base,
 wherein the first part includes a first sub-part disposed on the second part, and a second sub-part disposed under the second part, and the first and second sub-parts have thicknesses that are each about 5% to about 40% of a total thickness of the metallic base.

2. The deposition mask of claim 1, wherein the metallic base comprises a mask body having invar.

3. The deposition mask of claim 1, wherein the first part comprises a first side surface defining the first opening and having a rounded shape with a slope that changes in the thickness direction of the metallic base.

4. The deposition mask of claim 1, wherein the second part comprises a second side surface defining the second opening, and being inclined at a predetermined taper angle.

5. The deposition mask of claim 4, wherein the taper angle is about 30° to about 70°.

6. The deposition mask of claim 1, wherein the openings comprise through-parts and the width of each of the plurality of through-parts is about 10 mm to about 400 mm.

7. A method of manufacturing a deposition mask for a display panel, the method comprising:
 preparing a base having a thickness of about 50 micrometers to about 200 micrometers;
 reducing the thickness of the base by wet-etching at least one surface of the base to form a thickness-reduced section; and
 forming a plurality of openings by irradiating, with a laser, a portion of the thickness-reduced section,
 wherein
 the base has an upper surface and a lower surface facing the upper surface,
 the step of reducing the thickness of the base comprises wet-etching both the upper surface and the lower surface, and
 the step of forming the plurality of openings comprises irradiating the upper surface with the laser.

8. The method of claim 7, wherein the openings comprise through-parts, and the step of forming of the plurality of openings comprises forming the through-parts to have a width of about 10 mm to about 400 mm.

9. A method of manufacturing a display panel, the method comprising:
 preparing a target substrate;
 forming and disposing, on the target substrate, a deposition mask having a base with a thickness and a plurality of openings defined therein;
 forming, on the target substrate, a plurality of deposition patterns corresponding to the openings; and removing the deposition mask,
  wherein the forming of the deposition mask comprises:
    reducing the thickness of a base by wet-etching at least one surface of the base to form a thickness-reduced section; and
    forming a plurality of openings by etching a portion of the thickness-reduced section, and
  wherein
  the base has an upper surface and a lower surface facing the upper surface,
  the step of reducing the thickness of the base comprises wet-etching both the upper surface and the lower surface, and
  the step of forming the plurality of openings comprises irradiating the upper surface with the laser.

10. The method of claim 9, wherein the disposition mask comprises:
  a first part in which a first opening is defined; and
  a second part in which a second opening is defined, the second part having a width that increases in a direction downward from a top surface of the deposition mask along the thickness direction of the deposition mask.

11. The method of claim 10, wherein the first part comprises a first side surface defining the first opening and having a rounded shape with a slope that changes in the thickness direction.

12. The method of claim 10, wherein the second part comprises a second side surface defining the second opening, and being inclined at a predetermined taper angle so that the thickness thereof increases in a direction toward the target substrate.

13. The method of claim 9, wherein the target substrate comprises a base substrate and a plurality of circuit element layers disposed on the base substrate, and the plurality of deposition patterns are common layers respectively disposed on the plurality of circuit element layers.

14. The method of claim 13, wherein
  the plurality of circuit element layers comprises a first circuit element layer and a second circuit element layer spaced apart from on the first circuit element layer,
  the plurality of deposition patterns comprises a first deposition pattern disposed on the first circuit element layer, and a second deposition pattern disposed on the second circuit element layer, and
  the first deposition pattern and the second deposition pattern are spaced apart from each other.

* * * * *